(12) United States Patent  
Clinton et al.

(10) Patent No.: US 8,266,464 B2
(45) Date of Patent: Sep. 11, 2012

(54) POWER CONTROLLER, A METHOD OF OPERATING THE POWER CONTROLLER AND A SEMICONDUCTOR MEMORY SYSTEM EMPLOYING THE SAME

(75) Inventors: Michael P. Clinton, Allen, TX (US); Keerthinarayan P. Heragu, Richardson, TX (US); Uming U. Ko, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 715 days.

(21) Appl. No.: 11/876,600

(22) Filed: Oct. 22, 2007

(65) Prior Publication Data

US 2008/0098244 A1 Apr. 24, 2008

Related U.S. Application Data

(60) Provisional application No. 60/862,705, filed on Oct. 24, 2006.

(51) Int. Cl.
*G06F 1/32* (2006.01)
(52) U.S. Cl. .......... 713/320; 713/323; 713/324
(58) Field of Classification Search .......... 713/300, 713/320, 322, 323, 324
See application file for complete search history.

(56) References Cited

U.S. PATENT DOCUMENTS

| 5,524,248 | A | * | 6/1996 | Parks et al. | 713/324 |
| 5,615,162 | A | * | 3/1997 | Houston | 365/226 |
| 5,699,309 | A | * | 12/1997 | Cronin et al. | 365/203 |
| 5,835,435 | A | * | 11/1998 | Bogin et al. | 365/227 |
| 5,898,235 | A | * | 4/1999 | McClure | 307/64 |
| 6,118,719 | A | * | 9/2000 | Dell et al. | 365/222 |
| 2001/0018726 | A1 | * | 8/2001 | Tabo | 711/106 |
| 2005/0018528 | A1 | * | 1/2005 | Hellwig | 365/233 |
| 2005/0094473 | A1 | * | 5/2005 | Sakata et al. | 365/227 |
| 2005/0135175 | A1 | * | 6/2005 | Houston et al. | 365/229 |
| 2006/0259791 | A1 | * | 11/2006 | Dockser | 713/300 |

* cited by examiner

*Primary Examiner* — Kim Huynh
*Assistant Examiner* — Paul Yanchus, III
(74) *Attorney, Agent, or Firm* — Ronald O. Neerings; Wade James Brady, III; Frederick J. Telecky, Jr.

(57) ABSTRACT

Embodiments of the present disclosure provide a power controller, a method of operating a power controller and a semiconductor memory system. In one embodiment, the power controller is for use with a memory and includes an access module configured to provide an active state of the memory to allow memory access. The power controller also includes a retain-till-access module configured to cycle a portion of the memory between the active state and a low leakage data retention state of the memory. The power controller further includes an expanded retain-till-access module configured to extend the active state of the memory for a specified period of time before returning the memory to the low leakage data retention state.

14 Claims, 2 Drawing Sheets

POWER CONTROLLER, A METHOD OF OPERATING THE POWER CONTROLLER AND A SEMICONDUCTOR MEMORY SYSTEM EMPLOYING THE SAME

CROSS-REFERENCE TO PROVISIONAL APPLICATION

This application claims the benefit of U.S. Provisional Application No. 60/862,705 entitled "Leakage Reduction Modes for Semiconductor Memories" to Michael P. Clinton, et al., filed on Oct. 24, 2006, which is incorporated herein by reference in its entirety.

TECHNICAL FIELD

The present disclosure is directed, in general, to memory systems and, more specifically, to a power controller, a method of operating a power controller and a semiconductor memory system employing the controller or the method.

BACKGROUND

Portable electronic devices are increasingly more feature-rich, often requiring wireless communications and multimedia processing. These devices are also trending toward smaller physical size and increased computing power. CMOS circuits can play a dominant role in such devices, which are often integrated to the point of having a complete system on a chip (SoC). Even though these devices are smaller in size, power requirements typically have not diminished due to the demand for increased functionality. Additionally, applications require memories that can offer low leakage currents while still providing fast access and cycle times. Although current devices are providing acceptable performance, further improvements would prove beneficial in the art.

SUMMARY

Embodiments of the present disclosure provide a power controller, a method of operating a power controller and a semiconductor memory system. In one embodiment, the power controller is for use with a memory and includes an access module configured to provide an active state of the memory to allow memory access. The power controller also includes a retain-till-access module configured to cycle a portion of the memory between the active state and a low leakage data retention state of the memory. The power controller further includes an expanded retain-till-access module configured to extend the active state of the memory for a specified period of time before returning the memory to the low leakage data retention state.

In another aspect, the present disclosure provides a method of operating a power controller for use with a memory. The method includes providing an active state of the memory that allows memory access and cycling a portion of the memory between the active state and a low leakage data retention state of the memory. The method also includes extending the active state of the memory for a specified period of time before returning the memory to the low leakage data retention state.

The present disclosure also provides, in yet another aspect, a semiconductor memory system. The semiconductor memory system includes a plurality of memory blocks, a power supply coupled to the plurality of memory blocks and a power controller coupled to the power supply. The power controller has an input module that receives first and second memory mode signals and provides mutually exclusive access, retain-till-access and expanded retain-till-access control signals. The power controller also has an access module, coupled to the access output control signal, which provides an active state of the memory to allow memory access. The power controller additionally has a retain-till-access module, coupled to the retain-till-access control signal, which cycles a portion of the memory between the active state and a low leakage data retention state of the memory. The power controller further has an expanded retain-till-access module, coupled to the expanded retain-till-access control signal, which extends the active state of the memory for a specified period of time before returning the memory to the low leakage data retention state. The power controller still further has an output module that provides an output status signal corresponding to extending the active state.

The foregoing has outlined preferred and alternative features of the present disclosure so that those skilled in the art may better understand the detailed description of the disclosure that follows. Additional features of the disclosure will be described hereinafter that form the subject of the claims of the disclosure. Those skilled in the art will appreciate that they can readily use the disclosed conception and specific embodiment as a basis for designing or modifying other structures for carrying out the same purposes of the present disclosure.

BRIEF DESCRIPTION OF THE DRAWINGS

For a more complete understanding of the present disclosure, reference is now made to the following descriptions taken in conjunction with the accompanying drawings, in which.

DETAILED DESCRIPTION

In systems, including SoC designs, there are often many memories that are used in varied ways. Some require fast access and cycle time and do not need low leakage current. Others may need a low leakage current and can suffer slightly lower access and cycle times that are required to get the low leakage current. Still other memories need good leakage current reduction with the fastest possible access and cycle time. Embodiments of the present disclosure provide solutions that address these various memory requirements.

Figure 1:
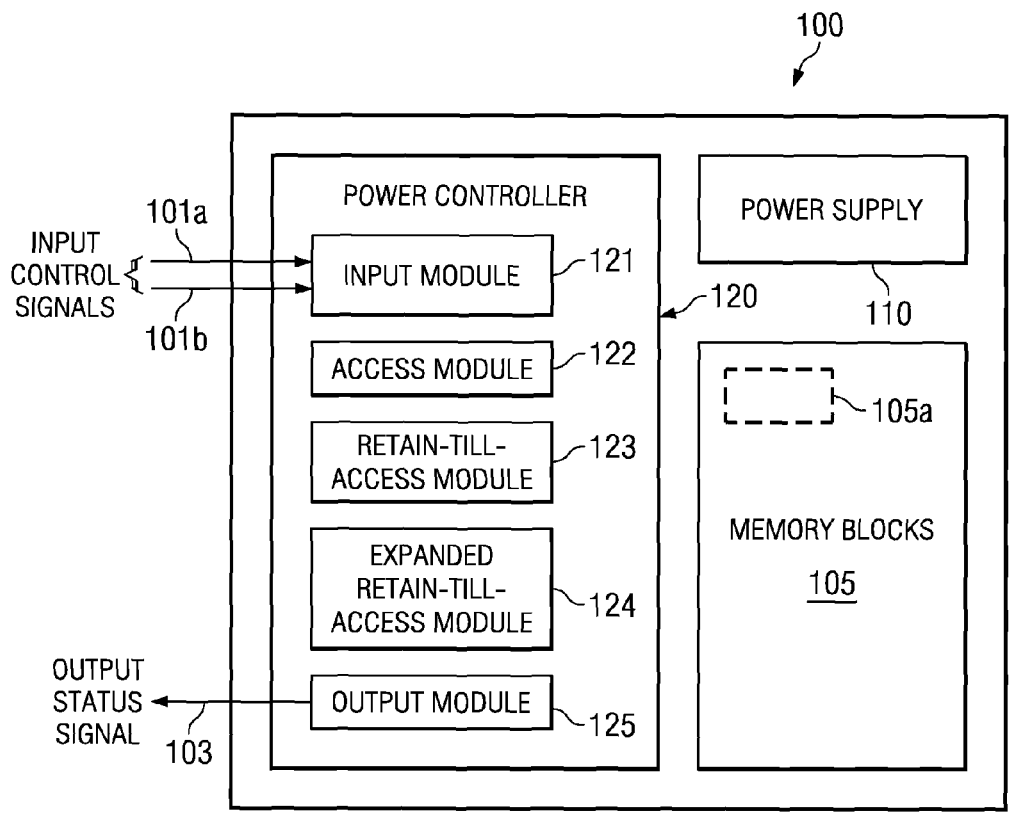
FIG. 1 illustrates a block diagram of a semiconductor memory system as provided by one embodiment of the disclosure.

FIG. 1 illustrates a block diagram of a semiconductor memory system 100 as provided by one embodiment of the disclosure. The semiconductor memory system 100 includes a plurality of memory blocks 105, a power supply 110 coupled to the plurality of memory blocks 105, and a power controller 120 coupled to the power supply 110. The semiconductor memory system 100 also includes first and second input memory mode signals 101a, 101b and an output status signal 103. The power controller 120 includes an input module 121, an access module 122, a retain-till-access module 123, an expanded retain-till-access module 124 and an output module 125.

The plurality of memory blocks 105 employ static random access memory (SRAM) cells, in the illustrated embodiment. The power supply provides each memory block with positive and negative supply voltages. The positive and negative supply voltages are scalable in voltage value as directed by the power controller 120. This scalability allows each of the memory blocks to range between a fully powered supply voltage that is needed for memory access and a retention supply voltage employed to retain data storage while reducing active leakage current in the plurality of memory blocks 105.

The input module 121 receives the first and second input memory mode signals 101$a$, 101$b$, which determine an operating mode for the memory blocks 105. The input module 121 then provides mutually exclusive access, retain-till-access and expanded retain-till-access control signals for the power controller 120. The access module 122 is controlled by the access control signal and provides an active state of the memory blocks 105 that allows memory access, when enabled by the access control signal. In this operating mode, all of the memory blocks 105 are fully powered allowing minimum access and cycle times for memory reading and writing.

The retain-till-access module 123 is controlled by the retain-till-access control signal and, when enabled, cycles a memory block 105$a$ between the active state and a low leakage data retention state that is employed for all of the memory blocks 105. In this operating mode, only the memory block 105$a$ is allowed to be fully powered to provide minimum access and cycle times for memory reading and writing. The low leakage data retention state provides a minimum powered leakage for all of the memory blocks 105. The memory block 105$a$ is a representative portion of the memory blocks 105 wherein it corresponds to a memory block controlled by a group of 32 word lines, in the illustrated embodiment. Of course, any grouping of word lines may define a memory block as deemed appropriate to a particular memory application.

The expanded retain-till-access module 124 is controlled by the expanded retain-till-access control signal. This operating mode extends the active state of all of the memory blocks 105 for a specified period of time before returning all of them to the low leakage data retention state. In one embodiment, the specified period of time restarts after each memory access that occurs during the extended active state. The specified period of time may correspond to a selected number of clock cycles employing a control counter. Alternatively, the specified period of time may be determined independent of the number of clock cycles. In either case, the specified period of time may be programmable. The output module 125 provides an output status signal that corresponds to extending the active state. This indicates that the memory blocks 105 are still in the active state that allows minimum access and cycle times for memory reading and writing.

Figure 2:
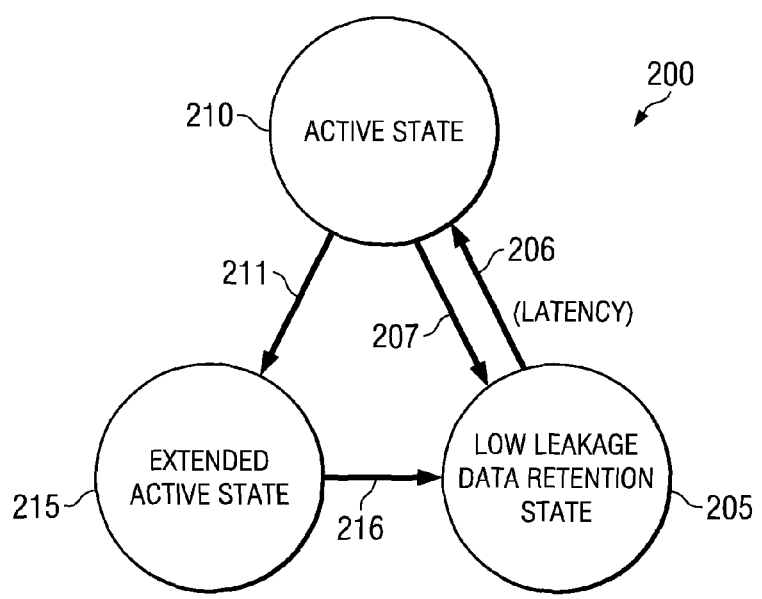
FIG. 2 illustrates a diagram of memory power states as provided by one embodiment of the disclosure.

FIG. 2 illustrates a diagram of memory power states 200 as provided by one embodiment of the disclosure. The memory power states 200 include a low leakage data retention state 205, an active state 210 and an extended active state 215. These states may be determined by a power controller such as the power controller 120 for a memory such as the plurality of memory blocks 105 of FIG. 1. The low leakage data retention state 205 is applied to the entire memory when at least a portion of the memory is not residing in another state. In the low leakage data retention state 205, the supply voltage across the memory is reduced to provide the smallest powered or active leakage current for the memory. Alternatively, the active state 210 corresponds to the largest leakage current of the memory.

A cycle of operating states for the entire memory is different than one employed when only a portion of the memory is accessed. A cycle path 206, 211, 216 is employed for the entire memory. Transitioning from the low leakage data retention state 205 to the active state 210 for the entire memory typically produces an access latency period of at least one clock cycle. This allows time for the entire memory to become fully active from its having been in a retention mode or "sleep mode". After this latency period, the entire memory may be accessed at minimum access and cycle times for reading or writing. At the completion of a memory access, the entire memory transitions to the extended active state 215.

In the extended active state 215, the entire memory may still be accessed at minimum access and cycle times, without latency. The extended active state 215 continues until either another memory access occurs within a pre-selected, specified period of time, or the time period expires without memory access. When the time period expires without memory access, the entire memory returns to the low leakage data retention state 205, thereby completing a memory cycle.

A cycle path 206, 207 is employed when only a portion of the memory is activated for reading or writing. Transitioning the portion of the memory from the low leakage data retention state 205 to the active state 210 typically does not produce an access latency period large enough to prohibit the memory portion from being accessed during the same clock cycle. This occurs since the capacitances associated with the memory portion selected are typically small enough to allow recovery to full power quickly. The memory portion is returned to the low leakage data retention state 205 after each memory access. This allows the entire memory or a portion of the memory to be activated for another memory access.

Figure 3:
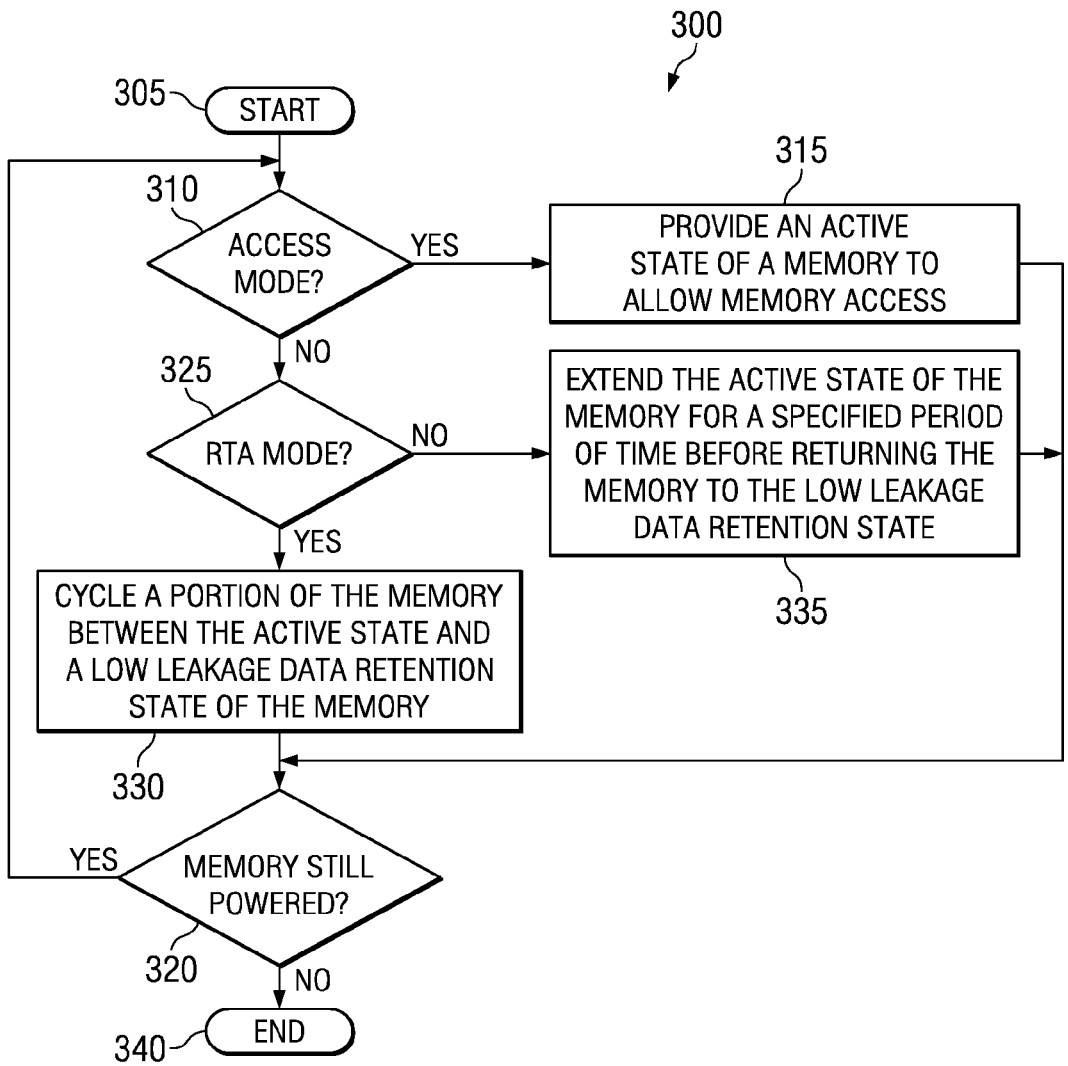
FIG. 3 illustrates a flow diagram of a method of operating a power controller carried out according to the principles of the present disclosure.

FIG. 3 illustrates a flow diagram of a method of operating a power controller 300 carried out according to the principles of the present disclosure. The method 300 is for use with a memory in a powered state and starts in a step 305. Then, in a first decisional step 310, it is determined if an access mode of the memory has been selected by an enabling access control signal. If the access mode has been selected, a fully active state is provided that allows access for reading from and writing to all of the memory, in a step 315. After each memory access in the step 315, a second decisional step 320 determines if the memory is still in the powered state. If the memory is still in the powered state and the access mode of the first decisional step 310 is still enabled, the method 300 returns to the step 315 for the next memory access.

If the first decisional step 310 determines that the access mode is not enabled, the method 300 continues to the third decisional step 325 wherein it is determined if a retain-till-access mode of the memory has been selected by an enabling retain-till-access control signal. If the retain-till-access mode has been selected, the fully active state is provided for a portion of the memory thereby allowing the memory portion to be accessed, in a step 330. Correspondingly, the remainder of the memory resides in a low leakage data retention state, which provides a minimum active leakage current for the remainder of the memory. In the fully active state, the portion of the memory is accessed only once before it cycles to the low leakage data retention state. This places all of the memory in the low leakage data retention state.

As before, the second decisional step 320 determines if the memory is still in the powered state. If the memory is still powered, and the first and third decisional steps 310, 325 determine that the access mode is not enabled and the retain-till-access mode is still enabled, the method 300 returns to the step 330 for the next access of the portion of the memory.

If the first and third decisional steps 310, 325 determine that the access and retain-till-access modes are not enabled, the method 300 continues to a step 335, which is an expanded retain-till-access mode. An expanded retain-till-access control signal enables the expanded retain-till-access mode, wherein all of the memory is initially placed in the low leakage data retention state thereby providing the minimum active leakage current for the memory. The fully active state is provided for all of the memory when it is accessed.

In this mode, the fully active state of the memory is extended for a specified period of time before the memory is returned to the low leakage data retention state. In one embodiment, extending the fully active state restarts after each memory access during the specified period of time. Additionally, the specified period of time may correspond to a preset timer or to a selected number of clock cycles that may be measured by a control counter. In either of these cases, the specified period of time may be programmable. A fully active state status signal is provided during the specified period of time to indicate that memory access is immediately available.

After the memory is returned to the low leakage data retention state, the second decisional step 320 again determines if the memory is still in the powered state. If the memory is still powered, and the first and third decisional steps 310, 325 determine that the access and the retain-till-access modes are not enabled, the method 300 returns to the step 335 for the next memory access. In this manner, the method 300 continues to select an appropriate mode as long as the memory remains in the powered state. If the second decisional step 320 determines that the memory is not in the powered state, the method 300 ends in a step 340.

While the method disclosed herein has been described and shown with reference to particular steps performed in a particular order, it will be understood that these steps may be combined, subdivided, or reordered to form an equivalent method without departing from the teachings of the present disclosure. Accordingly, unless specifically indicated herein, the order or the grouping of the steps is not a limitation of the present disclosure.

Those skilled in the art to which the disclosure relates will appreciate that other and further additions, deletions, substitutions and modifications may be made to the described example embodiments without departing from the disclosure.

What is claimed is:

1. A method of operating a static random access memory comprising a plurality of memory blocks within the memory, the memory operable in an active state when powered at a first power supply voltage, and in a low leakage data retention state when powered at a second power supply voltage that is lower than the first power supply voltage, the method comprising:
while in an access mode of operation, applying the first power supply voltage to the memory to place all of its memory blocks in an active state allowing memory access, and accessing one or more locations in the memory, wherein each memory access is performed in defined period of time, T;
while in a retain-till-access mode of operation, applying the second power supply voltage to all of the plurality of memory blocks until an access request is received, then only when an access request is received applying the first power supply voltage to only one of the memory blocks corresponding to the access request, accessing the one memory block, and then applying the second power supply voltage to all of the plurality of memory blocks upon completing the memory access; and
while in an extended retain-till-access mode of operation, applying the second power supply voltage to all of the plurality of memory blocks until an access request is received, then when an access request is received applying the first power supply voltage to all of the plurality of memory blocks corresponding to the access request, accessing the one memory block, waiting for a latency period of time, then accessing a requested one of the memory blocks;
measuring time after a memory access, while applying the first power supply voltage to the memory to maintain all of its memory blocks in the active state; and
responsive to the measured time reaching a specified period of time without a memory access occurring, applying the second power supply voltage to the memory to place all of its memory blocks into the low leakage data retention state.

2. The method as recited in claim 1 further comprising: during the measuring step, providing an output status signal indicating an extended active state.

3. The method as recited in claim 1 further comprising: restarting the measuring step responsive to a memory access occurring within the specified period of time.

4. The method as recited in claim 1 wherein the specified period of time corresponds to a selected number of clock cycles.

5. The method as recited in claim 4 wherein the measuring step comprises operating a control counter to count clock cycles.

6. The method as recited in claim 1 wherein the specified period of time is programmable.

7. The method of claim 1, wherein while in the retain-till-access mode, the memory access is performed in the time period T such that there is no latency in accessing the one memory block.

8. The method of claim 1, further comprising receiving an indication of the mode of operation on one or more memory mode signals.

9. A semiconductor memory system, comprising:
a memory comprising a plurality of memory blocks constructed from static random access memory operable in an active state when powered at a first power supply voltage, and in a low leakage data retention state when powered at a second power supply voltage that is lower than the first power supply voltage; and
a power controller circuit coupled to the plurality of memory blocks, including:
an input module that receives one or more memory mode signals indicative of two or more modes of operation;
an access module coupled to the input module, wherein while in a first mode of operation the access module is configured to direct the first power supply voltage to be applied to all of the plurality of memory blocks in the memory to enable an active state of the memory allowing memory access; and
a retain-till-access module coupled to the input module, wherein while in a second mode of operation the retain-till-access module is configured to apply the second power supply voltage to all of the plurality of memory blocks until an access request is received, then only when an access request is received apply the first power supply voltage to only one of the memory blocks corresponding to the access request, and then apply the second power supply voltage to all of the plurality of memory blocks upon completing the requested access:
an expanded retain-till-access module coupled to the input module, wherein while in a third mode of operation the expanded retain-till-access module is configured to apply the second power supply voltage to all of the plurality of memory blocks until an access request is received, then when a access request is received to apply the first power supply voltage to all of the plurality of memory blocks in the memory for a specified period of time following a memory access and, responsive to a memory access not occurring during the specified period of time, then directs the second power supply voltage to be applied to the plurality of memory blocks to enable the low leakage data retention state.

10. The system as recited in claim 9 wherein the expanded retain-till-access module restarts the specified period of time after each memory access during the specified period of time.

11. The system as recited in claim 9 wherein the specified period of time corresponds to a selected number of clock cycles.

12. The system as recited in claim 11 wherein a control counter measures the selected number of clock cycles.

13. The system as recited in claim 9 wherein the specified period of time is programmable.

14. The semiconductor memory system of claim 9, wherein while in the retain-till-access mode, the memory access is performed in a time period T such that there is no latency in accessing the one memory block.

* * * * *